(12) United States Patent
Miura et al.

(10) Patent No.: US 12,460,312 B2
(45) Date of Patent: Nov. 4, 2025

(54) WET TREATMENT APPARATUS AND METHOD OF MANUFACTURING FLEXIBLE PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Kousuke Miura, Osaka (JP); Koji Nitta, Osaka (JP); Shoichiro Sakai, Osaka (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 85 days.

(21) Appl. No.: 18/286,999

(22) PCT Filed: Apr. 13, 2022

(86) PCT No.: PCT/JP2022/017679
§ 371 (c)(1),
(2) Date: Oct. 14, 2023

(87) PCT Pub. No.: WO2022/224886
PCT Pub. Date: Oct. 27, 2022

(65) Prior Publication Data
US 2024/0200220 A1    Jun. 20, 2024

(30) Foreign Application Priority Data
Apr. 22, 2021 (JP) ................................. 2021-072460

(51) Int. Cl.
*C25D 7/06* (2006.01)
*C25D 17/00* (2006.01)
(Continued)

(52) U.S. Cl.
CPC ............... *C25D 7/06* (2013.01); *C25D 17/00* (2013.01); *H05K 3/0085* (2013.01); *H05K 3/18* (2013.01);
(Continued)

(58) Field of Classification Search
None
See application file for complete search history.

(56) References Cited

FOREIGN PATENT DOCUMENTS

| JP | 59-181870 U1 | 12/1984 |
|----|--------------|---------|
| JP | 2003-147582 A | 5/2003 |

(Continued)

OTHER PUBLICATIONS

Machine translation of Arai et al. WO 2008072403 A1 (Year: 2008).*

(Continued)

*Primary Examiner* — Wojciech Haske
(74) *Attorney, Agent, or Firm* — Renner, Otto, Boisselle & Sklar, LLP

(57) ABSTRACT

A wet treatment apparatus is configured to treat a continuously moving sheet-shaped workpiece and includes a wet treatment tank including a side surface portion having a first slit, a pair of rolls located outside the wet treatment tank, the pair of rolls being spaced apart from the first slit and being arranged in such a manner as to nip the workpiece in a transverse direction, and a pair of treatment-liquid shield members disposed on a side opposite to a side on which the wet treatment tank is disposed with the pair of rolls interposed between the pair of treatment-liquid shield members and the wet treatment tank in a movement direction of the workpiece. In a direction parallel to a width of the first slit, a width of the shield member is larger than a width of the roll.

17 Claims, 7 Drawing Sheets

(51) Int. Cl.
  *H05K 3/00* (2006.01)
  *H05K 3/18* (2006.01)
(52) U.S. Cl.
  CPC ............... *H05K 2203/0723* (2013.01); *H05K 2203/1545* (2013.01)

(56) References Cited

FOREIGN PATENT DOCUMENTS

| JP | 2017-031438 A | 2/2017 | | |
|----|---------------|--------|---|---|
| WO | WO-2008072403 A1 | * | 6/2008 | ............. C25D 21/10 |

OTHER PUBLICATIONS

International Search Report for corresponding Application No. PCT/JP2022/017679, mailed Jun. 28, 2022.

* cited by examiner

WET TREATMENT APPARATUS AND METHOD OF MANUFACTURING FLEXIBLE PRINTED CIRCUIT BOARD

TECHNICAL FIELD

The present disclosure relates to a wet treatment apparatus and a method of manufacturing a flexible printed circuit board. This application claims priority based on Japanese Patent Application No. 2021-072460 filed on Apr. 22, 2021, and the entire contents of the Japanese patent application are incorporated herein by reference.

BACKGROUND

Japanese Unexamined Patent Application Publication No. 2003-147582 (PTL 1) describes a continuous wet treatment apparatus. The continuous wet treatment apparatus includes two sealing rolls that sandwich a workpiece.

PRIOR ART DOCUMENT

Patent Literature

PTL 1: Japanese Unexamined Patent Application Publication No. 2003-147582

SUMMARY OF INVENTION

A wet treatment apparatus according to the present disclosure is configured to treat a continuously moving sheet-shaped workpiece. The wet treatment apparatus includes a wet treatment tank including a side surface portion having a first slit, the first slit extending in a height direction in such a manner as to allow the workpiece to pass through the first slit, a pair of rolls located outside the wet treatment tank, the pair of rolls being spaced apart from the first slit and being arranged in such a manner as to nip the workpiece in a transverse direction, and a pair of treatment-liquid shield members disposed on a side opposite to a side on which the wet treatment tank is disposed with the pair of rolls interposed between the pair of treatment-liquid shield members and the wet treatment tank in a movement direction of the workpiece. The side surface portion includes a first side surface portion and a second side surface portion with the first slit formed between the first side surface portion and the second side surface portion. The pair of treatment-liquid shield members include a first shield member and a second shield member, and the first shield member and the second shield member are arranged in such a manner as to allow the workpiece to pass between the first shield member and the second shield member. The pair of rolls include a first roll located between the first shield member and the first side surface portion and a second roll located between the second shield member and the second side surface portion. In a direction parallel to a width of the first slit, a width of the first shield member is larger than a width of the first roll, and a width of the second shield member is larger than a width of the second roll.

A wet treatment apparatus according to the present disclosure is configured to treat a continuously moving sheet-shaped workpiece. The wet treatment apparatus includes a wet treatment tank including a side surface portion having a first slit, the first slit extending in a height direction in such a manner as to allow the workpiece to pass through the first slit, a pair of rolls located outside the wet treatment tank, the pair of rolls being arranged in such a manner as to nip the workpiece in a transverse direction, a pair of treatment-liquid shield members disposed on a side opposite to a side on which the wet treatment tank is disposed with the pair of rolls interposed between the pair of treatment-liquid shield members and the wet treatment tank in a movement direction of the workpiece, an auxiliary chamber provided between the side surface portion and the pair of rolls, and an additional pair of rolls provided inside the auxiliary chamber. The auxiliary chamber includes a side surface portion of the auxiliary chamber having a second slit, the second slit extending in a height direction in such a manner as to allow the workpiece to pass through the second slit. The side surface portion of the auxiliary chamber includes a third side surface portion and a fourth side surface portion with the second slit formed between the third side surface portion and the fourth side surface portion. The pair of treatment-liquid shield members include a first shield member and a second shield member, and the first shield member and the second shield member are arranged in such a manner as to allow the workpiece to pass between the first shield member and the second shield member. The pair of rolls include a first roll located between the first shield member and the third side surface portion and a second roll located between the second shield member and the fourth side surface portion. In a direction parallel to a width of the second slit, a width of the first shield member is larger than a width of the first roll, and a width of the second shield member is larger than a width of the second roll.

A method of manufacturing a flexible printed circuit board according to the present disclosure includes preparing a wet treatment apparatus including a wet treatment tank, and performing a wet treatment on a flexible printed circuit board base member having a sheet-like shape in the wet treatment tank. The wet treatment apparatus is a wet treatment apparatus configured to treat the flexible printed circuit board base member that continuously moves. The wet treatment apparatus includes a wet treatment tank including a side surface portion having a first slit, the first slit extending in a height direction in such a manner as to allow the flexible printed circuit board base member to pass through the first slit, a pair of rolls located outside the wet treatment tank, the pair of rolls being spaced apart from the first slit and being arranged in such a manner as to nip the flexible printed circuit board base member in a transverse direction, and a pair of treatment-liquid shield members disposed on a side opposite to a side on which the wet treatment tank is disposed with the pair of rolls interposed between the pair of treatment-liquid shield members and the wet treatment tank in a movement direction of the flexible printed circuit board base member. The side surface portion includes a first side surface portion and a second side surface portion with the first slit formed between the first side surface portion and the second side surface portion. The pair of treatment-liquid shield members include a first shield member and a second shield member, and the first shield member and the second shield member are arranged in such a manner as to allow the flexible printed circuit board base member to pass between the first shield member and the second shield member. The pair of rolls include a first roll located between the first shield member and the first side surface portion and a second roll located between the second shield member and the second side surface portion. In a direction parallel to a width of the first slit, a width of the first shield member is larger than a width of the first roll, and a width of the second shield member is larger than a width of the second roll.

According to another aspect of the present disclosure, there is provided a method of manufacturing a flexible printed circuit board, the method includes preparing a wet treatment apparatus including a wet treatment tank, and performing a wet treatment on a flexible printed circuit board base member having a sheet-like shape in the wet treatment tank. The wet treatment apparatus is a wet treatment apparatus configured to treat the flexible printed circuit board base member that continuously moves. The wet treatment apparatus includes a wet treatment tank including a side surface portion having a first slit, the first slit extending in a height direction in such a manner as to allow the flexible printed circuit board base member to pass through the first slit, a pair of rolls located outside the wet treatment tank, the pair of rolls being arranged in such a manner as to nip the flexible printed circuit board base member in a transverse direction, a pair of treatment-liquid shield members disposed on a side opposite to a side on which the wet treatment tank is disposed with the pair of rolls interposed between the pair of treatment-liquid shield members and the wet treatment tank in a movement direction of the flexible printed circuit board base member, an auxiliary chamber provided between the side surface portion and the pair of rolls, and an additional pair of rolls provided inside the auxiliary chamber. The auxiliary chamber includes a side surface portion of the auxiliary chamber having a second slit, the second slit extending in a height direction in such a manner as to allow the flexible printed circuit board base member to pass through the second slit. The side surface portion of the auxiliary chamber includes a third side surface portion and a fourth side surface portion with the second slit formed between the third side surface portion and the fourth side surface portion. The pair of treatment-liquid shield members include a first shield member and a second shield member, and the first shield member and the second shield member are arranged in such a manner as to allow the flexible printed circuit board base member to pass between the first shield member and the second shield member. The pair of rolls include a first roll located between the first shield member and the third side surface portion and a second roll located between the second shield member and the fourth side surface portion. In a direction parallel to a width of the second slit, a width of the first shield member is larger than a width of the first roll, and a width of the second shield member is larger than a width of the second roll.

DETAILED DESCRIPTION

Figure 1:
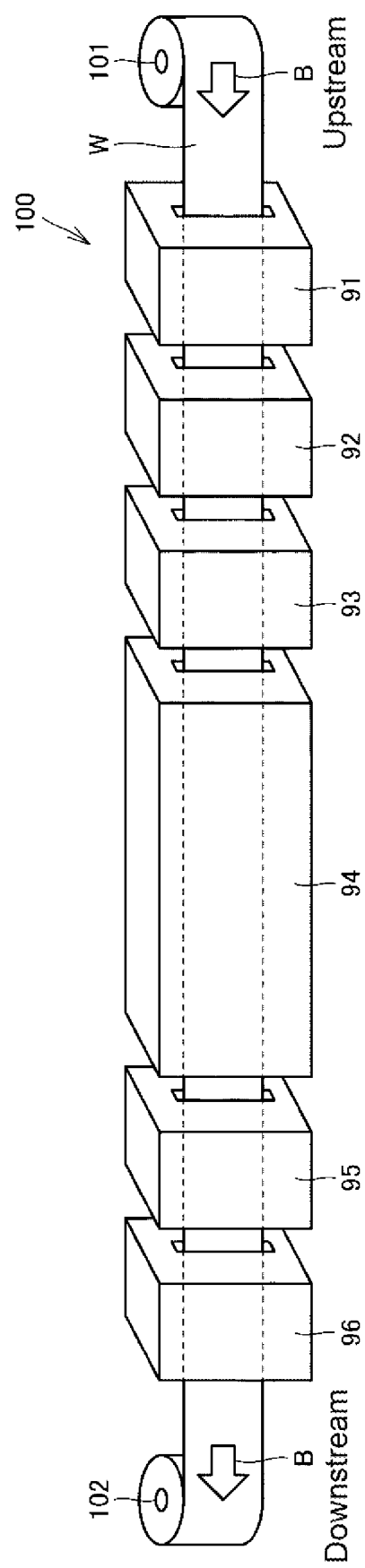
FIG. 1 is a schematic perspective view showing an overall configuration of a wet treatment apparatus according to a first embodiment.

Problems to be Solved by Present Disclosure

In the conventional continuous wet treatment apparatus, the treatment liquid leaked from a treatment tank may adhere to the workpiece, thereby deteriorating the quality of the workpiece.

An object of the present disclosure is to provide a wet treatment apparatus and a method of manufacturing a flexible printed circuit board, which are capable of suppressing deterioration of quality of a workpiece.

Advantageous Effects of the Invention

According to the present disclosure, it is possible to provide a wet treatment apparatus and a method of manufacturing a flexible printed circuit board, which are capable of suppressing deterioration in quality of a workpiece.

DESCRIPTION OF EMBODIMENTS OF PRESENT DISCLOSURE

First, an overview of embodiments of the present disclosure will be described.

(1) A wet treatment apparatus 100 according to the present disclosure is the wet treatment apparatus 100 configured to treat a continuously moving sheet-shaped workpiece W. The wet treatment apparatus 100 includes a wet treatment tank 1 including a side surface portion having a first slit S1, the first slit S1 extending in a height direction in such a manner as to allow the workpiece W to pass through the first slit S1, a pair of rolls 10 located outside the wet treatment tank 1, the pair of rolls 10 being spaced apart from the first slit S1 and being arranged in such a manner as to nip the workpiece W in a transverse direction, and a pair of treatment-liquid shield members 20 disposed on a side opposite to a side on which the wet treatment tank 1 is disposed with the pair of rolls 10 interposed between the pair of treatment-liquid shield members 20 and the wet treatment tank 1 in a movement direction of the workpiece W. The side surface portion 3 includes a first side surface portion 31 and a second side surface portion 32 with the first slit S1 formed between the first side surface portion 31 and the second side surface portion 32. The pair of treatment-liquid shield members 20 include a first shield member 21 and a second shield member 22, and the first shield member 21 and the second shield member 22 are arranged in such a manner as to allow the workpiece W to pass between the first shield member 21 and the second shield member 22. The pair of rolls 10 include a first roll 11 located between the first shield member 21 and first side surface portion 31 and a second roll 12 located between the second shield member 22 and the second side surface portion 32. In a direction parallel to a width of the first slit S1, a width of the first shield member 21 is larger than a width of the first roll 11, and a width of the second shield member 22 is larger than a width of the second roll 12.

(2) According to the wet treatment apparatus 100 of (1), each of a distance between the first side surface portion 31 and the first roll 11 in the movement direction of the workpiece W and a distance between the second side surface portion 32 and the second roll 12 in the movement direction of the workpiece W may be larger than the width of the first slit S1.

(3) According to the wet treatment apparatus 100 according to (1) or (2), a height of the first roll 11 and a height of the second roll 12 may be each equal to a height of the first slit S1 or may be larger than the height of the first slit S1.

(4) In the wet treatment apparatus 100 according to any one of (1) to (3), the pair of rolls 10 and the pair of treatment-liquid shield members 20 may be positioned upstream from the wet treatment tank 1 in the movement direction of the workpiece W.

(5) A wet treatment apparatus 100 according to the present disclosure is the wet treatment apparatus 100 configured to treat a continuously moving sheet-shaped workpiece W. The wet treatment apparatus 100 includes a wet treatment tank 1 including a side surface portion 3 having a first slit S1, the first slit S1 extending in a height direction in such a manner as to allow the workpiece W to pass through the first slit S1, a pair of rolls 10 located outside the wet treatment tank 1, the pair of rolls 10 being arranged in such a manner as to nip the workpiece W in a transverse direction, a pair of treatment-liquid shield members 20 disposed on a side opposite to a side on which the wet treatment tank 1 is disposed with the pair of rolls 10 interposed between the pair of treatment-liquid shield members 20 and the wet treatment tank 1 in a movement direction of the workpiece W, an auxiliary chamber 30 provided between the side surface portion 3 and the pair of rolls 10, and an additional pair of rolls provided inside the auxiliary chamber 30. The auxiliary chamber 30 includes a side surface portion 50 of the auxiliary chamber having a second slit S2, the second slit S2 extending in a height direction in such a manner as to allow the workpiece W to pass through the second slit S2. The side surface portion 50 of the auxiliary chamber includes a third side surface portion 33 and a fourth side surface portion 34 with the second slit S2 formed between the third side surface portion 33 and the fourth side surface portion 34. The pair of treatment-liquid shield members 20 include a first shield member 21 and a second shield member 22, and the first shield member 21 and the second shield member 22 are arranged in such a manner as to allow the workpiece W to pass between the first shield member 21 and the second shield member 22. The pair of rolls 10 include a first roll 11 located between the first shield member 21 and the third side surface portion 33 and a second roll 12 located between the second shield member 22 and the fourth side surface portion 34. In a direction parallel to a width of the second slit S2, a width of the first shield member 21 is larger than a width of the first roll 11, and a width of the second shield member 22 is larger than a width of the second roll 12.

(6) In the wet treatment apparatus 100 according to (5), each of a distance between the third side surface portion 33 and the first roll 11 in the movement direction of the workpiece WV and a distance between the fourth side surface portion 34 and the second roll 12 in the movement direction of the workpiece W may be larger than the width of the second slit S2.

(7) According to the wet treatment apparatus 100 according to (5) or (6), a height of the first roll 11 and a height of the second roll 12 may be each equal to a height of the second slit S2 or larger than the height of the second slit S2.

(8) In the wet treatment apparatus 100 according to any one of (5) to (7), the pair of rolls 10, the pair of treatment-liquid shield members 20, the auxiliary chamber 30, and the additional pair of rolls may be positioned upstream from the wet treatment tank 1 in the movement direction of the workpiece W.

(9) In the wet treatment apparatus 100 according to any one of (1) to (8), the wet treatment tank 1 may be a plating treatment tank.

(10) In the wet treatment apparatus 100 according to any one of (1) to (9), the pair of treatment-liquid shield members 20 each may have a plate-like shape.

(11) A method of manufacturing a flexible printed circuit board 200 according to the present disclosure the method includes preparing a wet treatment apparatus 100 including a wet treatment tank 1, and performing a wet treatment on a flexible printed circuit board base member (workpiece W) having a sheet-like shape in the wet treatment tank 1. The wet treatment apparatus 100 is the wet treatment apparatus 100 configured to treat the flexible printed circuit board base member that continuously moves. The wet treatment apparatus 100 includes the wet treatment tank 1 including a side surface portion 3 having a first slit S1, the first slit S1 extending in a height direction in such a manner as to allow the flexible printed circuit board base member to pass through the first slit S1, a pair of rolls 10 located outside the wet treatment tank 1, the pair of rolls 10 being spaced apart from the first slit S1 and being arranged in such a manner as to nip the flexible printed circuit board base member in a transverse direction, and a pair of treatment-liquid shield members 20 disposed on a side opposite to a side on which the wet treatment tank 1 is disposed with the pair of rolls 10 interposed between the pair of treatment-liquid shield members 20 and the wet treatment tank 1 in a movement direction of the flexible printed circuit board base member. The side surface portion 3 includes a first side surface portion 31 and a second side surface portion 32 with the first slit S1 formed between the first side surface portion 31 and the second side surface portion 32. The pair of treatment-liquid shield members 20 include a first shield member 21 and a second shield member 22, and the first shield member 21 and the second shield member 22 are arranged in such a manner as to allow the flexible printed circuit board base member to pass between the first shield member 21 and the second shield member 22. The pair of rolls 10 include a first roll 11 located between the first shield member 21 and the first side surface portion 31 and a second roll 12 located between the second shield member 22 and the second side surface portion 32. In a direction parallel to a width of the first slit S1, a width of the first shield member 21 is larger than a width of the first roll 11, and a width of the second shield member 22 is larger than a width of the second roll 12.

(12) According to the method of manufacturing the flexible printed circuit board 200 according to (11), each of a distance between the first side surface portion 31 and the first roll 11 in the movement direction of the flexible printed circuit board base member and a distance between the second side surface portion 32 and the second roll 12 in the movement direction of the flexible printed circuit board base member may be larger than the width of the first slit S1.

(13) According to the method of manufacturing the flexible printed circuit board 200 according to (11) or (12), a height of the first roll 11 and a height of the second roll 12 may be each equal to a height of the first slit S1 or larger than the height of the first slit S1.

(14) In the method of manufacturing the flexible printed circuit board 200 according to any one of (11) to (13), the pair of rolls 10 and the pair of treatment-liquid shield members 20 may be positioned upstream from the wet treatment tank 1 in the movement direction of the flexible printed circuit board base member.

(15) According to another aspect of the present disclosure, there is provided a method of manufacturing a flexible printed circuit board 200. The method includes preparing a wet treatment apparatus including a wet treatment tank 1, and performing a wet treatment on a flexible printed circuit board base member having a sheet-like shape in the wet treatment tank 1. The wet treatment apparatus 100 is the wet treatment apparatus 100 configured to treat the flexible printed circuit board base member that continuously moves. The wet treatment apparatus 100 includes the wet treatment tank 1 including a side surface portion 3 having a first slit S1, the first slit S1 extending in a height direction in such a manner as to allow the flexible printed circuit board base member to pass through the first slit S1, a pair of rolls 10 located outside the wet treatment tank 1, the pair of rolls 10 being arranged in such a manner as to nip the flexible printed circuit board base member in a transverse direction, a pair of treatment-liquid shield members 20 disposed on a side opposite to a side on which the wet treatment tank 1 is disposed with the pair of rolls 10 interposed between the pair of treatment-liquid shield members 20 and the wet treatment tank 1 in a movement direction of the flexible printed circuit board base member, an auxiliary chamber 30 provided between the side surface portion 3 and the pair of rolls 10, and an additional pair of rolls provided inside the auxiliary chamber 30. The auxiliary chamber 30 includes a side surface portion 50 of the auxiliary chamber having a second slit S2, the second slit S2 extending in a height direction in such a manner as to allow the flexible printed circuit board base member to pass through the second slit S2. The side surface portion 50 of the auxiliary chamber includes a third side surface portion 33 and a fourth side surface portion 34 with the second slit S2 formed between the third side surface portion 33 and the fourth side surface portion 34. The pair of treatment-liquid shield members 20 include a first shield member 21 and a second shield member 22, and the first shield member 21 and the second shield member 22 are arranged in such a manner as to allow the flexible printed circuit board base member to pass between the first shield member 21 and the second shield member 22. The pair of rolls 10 include a first roll 11 located between the first shield member 21 and the third side surface portion 33 and a second roll 12 located between the second shield member 22 and the fourth side surface portion 34. In a direction parallel to a width of the second slit S2, a width of the first shield member 21 is larger than a width of the first roll 11, and a width of the second shield member 22 is larger than a width of the second roll 12.

(16) According to the method of manufacturing the flexible printed circuit board 200 according to (15), a distance between the third side surface portion 33 and the first roll 11 in the movement direction of the flexible printed circuit board base member and a distance between the fourth side surface portion 34 and the second roll 12 in the movement direction of the flexible printed circuit board base member may be each larger than the width of the second slit S2.

(17) In the method of manufacturing the flexible printed circuit board 200 according to (15) or (16), a height of the first roll 11 and a height of the second roll 12 may be each equal to a height of the second slit S2 or larger than the height of the second slit S2.

(18) According to the method of manufacturing the flexible printed circuit board 200 according to any one of (15) to (17), the pair of rolls 10, the pair of treatment-liquid shield members 20, the auxiliary chamber 30, and the additional pair of rolls may be positioned upstream from the wet treatment tank 1 in the movement direction of the flexible printed circuit board base member.

(19) According to the method of manufacturing the flexible printed circuit board 200 according to any one of (11) to (18), the wet treatment tank 1 may be a plating treatment tank.

(20) In the method of manufacturing the flexible printed circuit board 200 according to any one of (11) to (19), the pair of treatment-liquid shield members 20 each may have a plate-like shape.

(21) In the method of manufacturing the flexible printed circuit board 200 according to any one of (11) to (20), a moving speed of the flexible printed circuit board base member may be 0.1 m/min to 0.5 m/min.

DETAILS OF EMBODIMENTS OF PRESENT DISCLOSURE

The details of embodiments of the present disclosure are described below. In the following description, identical or corresponding elements are provided with the same reference signs and will not be described repeatedly.

<Wet Treatment Apparatus>

First Embodiment

First, a configuration of a wet treatment apparatus 100 according to a first embodiment of the present disclosure will be described. FIG. 1 is a schematic perspective view showing an overall configuration of wet treatment apparatus 100 according to the first embodiment. Wet treatment apparatus 100 according to the first embodiment is wet treatment apparatus 100 for treating a continuously moving workpiece W. As shown in FIG. 1, wet treatment apparatus 100 mainly includes a conveying unit 101, a winding unit 102, a first treatment tank 91, a second treatment tank 92, a third treatment tank 93, a fourth treatment tank 94, a fifth treatment tank 95, and a sixth treatment tank 96. Conveying unit 101 is a machine that feeds out workpiece W before processing. In conveying unit 101, workpiece W before processing is wound in a roller shape. Winding unit 102 is a machine that collects processed workpiece W. In winding unit 102, processed workpiece W is wound in a roller shape. The type of workpiece W is not particularly limited, but is a long sheet-like member, and is, for example, a flexible printed circuit board in which a thin film circuit is formed on a polyimide base member. A movement direction of workpiece W is substantially the same as the longitudinal direction of workpiece W, and a direction perpendicular to the longitudinal direction is a width direction of workpiece W. The width direction of workpiece W is substantially the same as the height direction of wet treatment apparatus 100.

As shown in FIG. 1, in a movement direction B of workpiece W, each of first treatment tank 91, second treatment tank 92, third treatment tank 93, fourth treatment tank 94, fifth treatment tank 95, and sixth treatment tank 96 is arranged between conveying unit 101 and winding unit 102.

Workpiece W conveyed from conveying unit 101 sequentially passes through first treatment tank 91, second treatment tank 92, third treatment tank 93, fourth treatment tank 94, fifth treatment tank 95, and sixth treatment tank 96, and is collected by winding unit 102.

In first treatment tank 91, a degreasing treatment is performed on workpiece W. In first treatment tank 91, treatment liquid for degreasing treatment is contained. In second treatment tank 92, a water washing treatment is performed on workpiece W. In second treatment tank 92, a treatment liquid for water washing treatment is contained. In third treatment tank 93, an acid cleaning treatment is performed on workpiece W. In third treatment tank 93, a treatment liquid for acid cleaning is contained.

In fourth treatment tank 94, an electroplating treatment is performed on workpiece W. In fourth treatment tank 94, a treatment liquid for electroplating treatment is contained. In fifth treatment tank 95, a water washing treatment is performed on workpiece W. In fifth treatment tank 95, a treatment liquid for water washing treatment is contained. In sixth treatment tank 96, a drying treatment is performed on workpiece W.

First treatment tank 91 is located downstream in movement direction B of workpiece W relative to conveying unit 101. In movement direction B of workpiece W, first treatment tank 91 is located between conveying unit 101 and second treatment tank 92. Second treatment tank 92 is located downstream in movement direction B of workpiece W relative to first treatment tank 91. In movement direction B of workpiece W, second treatment tank 92 is located between first treatment tank 91 and third treatment tank 93. A gap may be provided between first treatment tank 91 and second treatment tank 92.

Third treatment tank 93 is located downstream in movement direction B of workpiece W relative to second treatment tank 92. In movement direction B of workpiece W, third treatment tank 93 is located between second treatment tank 92 and fourth treatment tank 94. A gap may be provided between second treatment tank 92 and third treatment tank 93. Fourth treatment tank 94 is located downstream in movement direction B of workpiece W relative to third treatment tank 93. In movement direction B of workpiece W, fourth treatment tank 94 is located between third treatment tank 93 and fifth treatment tank 95. A gap may be provided between third treatment tank 93 and fourth treatment tank 94.

Fifth treatment tank 95 is located downstream in movement direction B of workpiece W relative to fourth treatment tank 94. In movement direction B of workpiece W, fifth treatment tank 95 is located between fourth treatment tank 94 and sixth treatment tank 96. A gap may be provided between fourth treatment tank 94 and fifth treatment tank 95. Sixth treatment tank 96 is located downstream in movement direction B of workpiece W relative to fifth treatment tank 95. In movement direction B of workpiece W, sixth treatment tank 96 is located between winding unit 102 and fifth treatment tank 95. A gap may be provided between fifth treatment tank 95 and sixth treatment tank 96.

Figure 2:
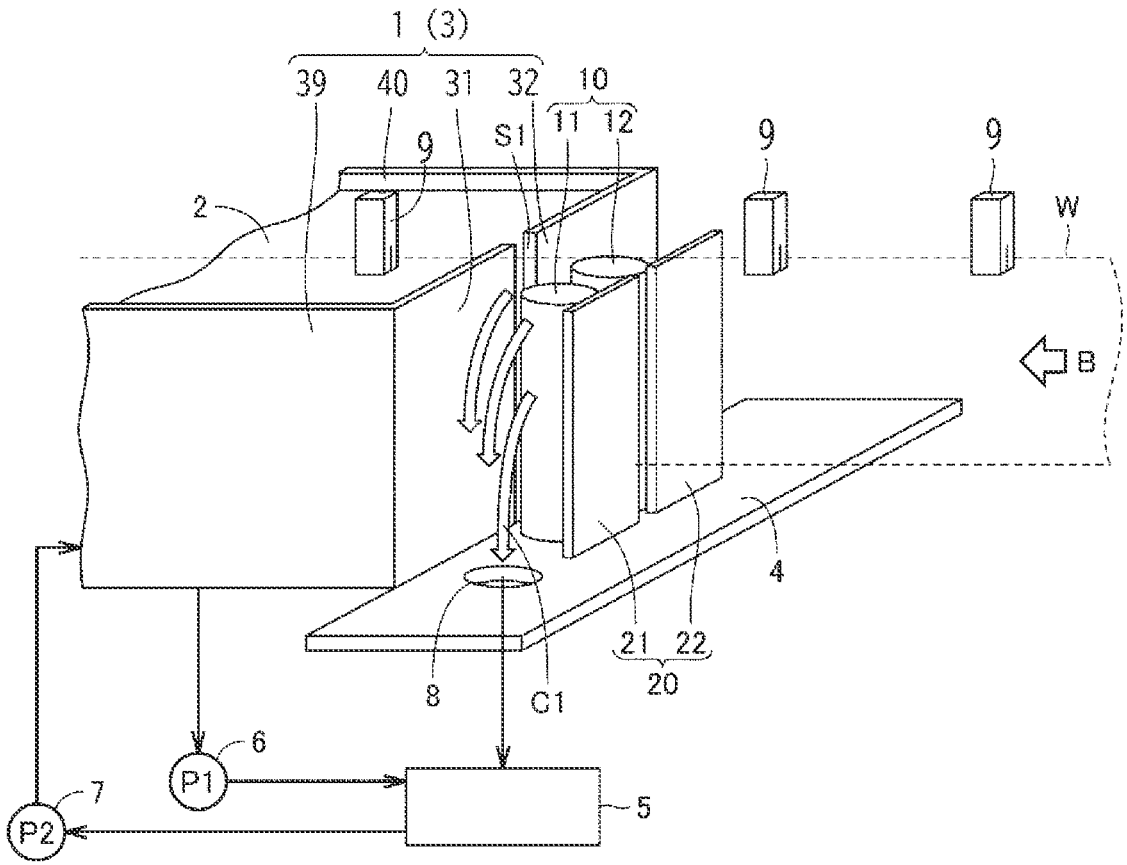
FIG. 2 is a schematic perspective view showing a configuration of a part of the wet treatment apparatus according to the first embodiment.

FIG. 2 is a schematic perspective view showing a configuration of a part of the wet treatment apparatus 100 according to the first embodiment. As shown in FIG. 2, wet treatment apparatus 100 mainly includes a wet treatment tank 1, a pair of rolls 10, a pair of treatment-liquid shield members 20, a bottom plate 4, a management tank 5, a first pump P1 (6), a second pump P2 (7), and a transport clip 9. Wet treatment tank 1 may be any one of first treatment tank 91 to sixth treatment tank 96. Wet treatment tank 1 may be, for example, a water washing treatment tank, an acid washing treatment tank, or a degreasing treatment tank. Wet treatment tank 1 is, for example, fourth treatment tank 94. Wet treatment tank 1 is, for example, a plating treatment tank. Wet treatment tank 1 contains a treatment liquid 2. Treatment liquid 2 is, for example, a plating liquid.

Wet treatment tank 1 is provided with a first slit S1 through which workpiece W passes. Specifically, first slit S1 is provided in a side surface portion 3. Side surface portion 3 includes a first side surface portion 31 and a second side surface portion 32 with first slit S1 formed therebetween. A part of treatment liquid 2 leaks out from first slit S1. A liquid C1 leaked from first slit S1 of wet treatment tank 1 passes through a liquid discharge hole 8 provided in bottom plate 4 and enters management tank 5. First pump P1 is provided between wet treatment tank 1 and management tank 5. First pump P1 returns treatment liquid 2 in wet treatment tank 1 to management tank 5. Second pump P2 is provided between wet treatment tank 1 and management tank 5. Second pump P2 feeds out treatment liquid 2 treated in management tank 5 to wet treatment tank 1. As described above, treatment liquid 2 circulates between wet treatment tank 1 and management tank 5.

Transport clip 9 transports workpiece W while gripping workpiece W. Transport clip 9 moves from the upstream to the downstream. As a result, workpiece W is transferred from upstream to downstream. Transport clip 9 grips workpiece W so as to sandwich the upper end of workpiece W from both sides, for example. A plurality of transport clips 9 are provided along movement direction B of workpiece W.

Pair of rolls 10 are located outside wet treatment tank 1. Pair of rolls 10 are attached to bottom plate 4, for example. Pair of rolls 10 are spaced apart from first slit S1 Pair of rolls 10 include a first roll 11 and a second roll 12. Each of first roll 11 and second roll 12 is spaced apart from first slit S1. Pair of rolls 10 are arranged in such a manner as to nip the workpiece W in a transverse direction. A gap is provided between first roll 11 and second roll 12 so that workpiece W can pass between first roll 11 and second roll 12. Due to pair of rolls 10, liquid C1 leaking from slit S1 flows out in a direction substantially perpendicular to movement direction B of workpiece W. Thus, leaked liquid C1 is prevented from adhering to workpiece W.

Pair of treatment-liquid shield members 20 are located on a side opposite to first slit S1 with respect to pair of rolls 10 in movement direction B of workpiece W. Pair of treatment-liquid shield members 20 is, in other words, in movement direction B of workpiece W, pair of rolls 10 are arranged between wet treatment tank 1 and pair of treatment-liquid shield members 20. Pair of treatment-liquid shield members 20 are arranged in such a manner as to nip workpiece W in the transverse direction. Pair of treatment-liquid shield members 20 include a first shield member 21 and a second shield member 22. A gap is provided between first shield member 21 and second shield member 22 so that workpiece W can pass between first shield member 21 and second shield member 22. Pair of treatment-liquid shield members 20 may have plate-like shapes. Liquid C1 leaking out from slit S1 in a direction substantially perpendicular to movement direction B of workpiece W hits bottom plate 4 and bounces back to generate droplets. Pair of treatment-liquid shield members 20 can prevent droplets from adhering to workpiece W before being introduced into wet treatment tank 1.

Figure 3:
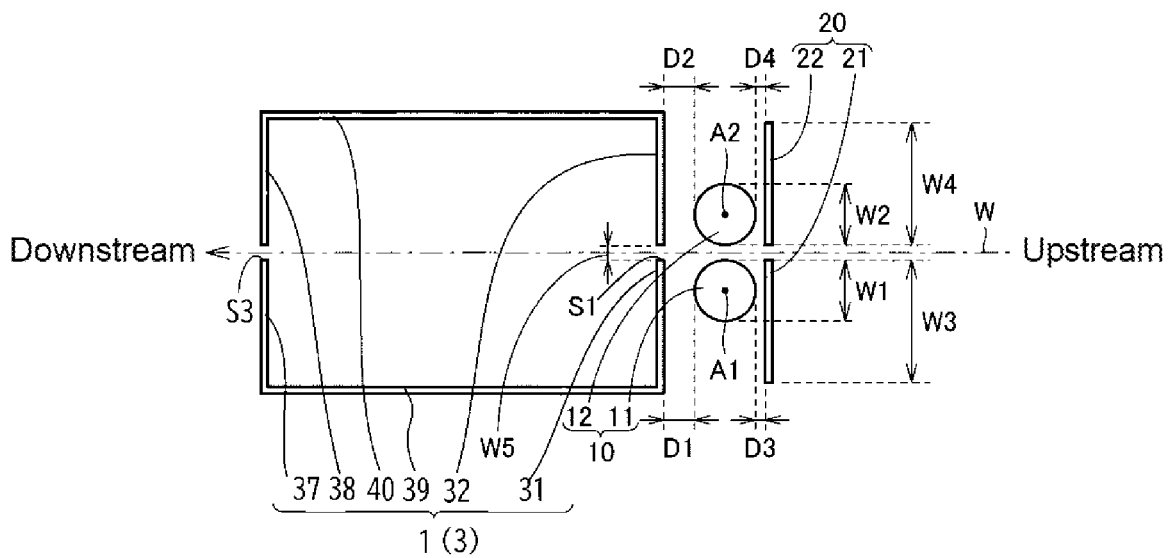
FIG. 3 is a schematic top view showing a configuration of a part of the wet treatment apparatus according to the first embodiment.

FIG. 3 is a schematic top view showing a configuration of a part of wet treatment apparatus 100 in accordance with the first embodiment. As shown in FIG. 3, pair of rolls 10 and pair of treatment-liquid shield members 20 may be positioned upstream from wet treatment tank 1 in movement direction B of workpiece W. First roll 11 is located between first shield member 21 and first side surface portion 31. Second roll 12 is located between second shield member 22 and second side surface portion 32. Pair of rolls 10 and pair of treatment-liquid shield members 20 are located, for example, in the gap between third treatment tank 93 and fourth treatment tank 94 (refer to FIG. 1).

As shown in FIG. 3, first roll 11 rotates about a first rotation axis A1. Second roll 12 rotates about a second rotation axis A2. Workpiece W is in contact with each of first roll 11 and second roll 12. As workpiece W passes between first roll 11 and second roll 12, each of first roll 11 and second roll 12 rotates. Each of first roll 11 and second roll 12 is, for example, a liquid cutting roll. In other words, each of first roll 11 and second roll 12 removes a portion of treatment liquid 2 adhered to workpiece W. A plane containing first rotation axis A1 and second rotation axis A2 may be perpendicular to movement direction B of workpiece W.

Wet treatment tank 1 has a pair of side surface portions 3 (including a ninth side surface portion 39 and a tenth side surface portion 40) extending in a direction parallel to movement direction B of workpiece W, and upstream side surface portion 3 (first side surface portion 31 and second side surface portion 32) and downstream side surface portion 3 (a seventh side surface portion 37 and an eighth side surface portion 38) extending in a direction perpendicular to movement direction B of workpiece W.

In a top view, wet treatment tank 1 may have a substantially rectangular shape. Upstream side surface portion 3 is provided with first slit S1 along the height direction of wet treatment tank 1. Downstream side surface portion 3 is provided with a third slit S3 along the height direction of wet treatment tank 1. Workpiece W enters into wet treatment tank 1 through first slit S1. Workpiece W passes through third slit S3 from the inside of wet treatment tank 1 to the outside.

As shown in FIG. 3, in a top view, a width of first slit S1 (a fifth width W5) is not particularly limited, but is, for example, 5 mm. A width of first roll 11 (a first width W1) in the direction parallel to first slit S1 is not particularly limited, but is, for example, 32 mm. A width of first shield member 21 (a third width W3) in the direction parallel to first slit S1 is larger than the width of first roll 11 (first width W1). A width of second roll 12 (a second width W2) in the direction parallel to first slit S1 is not particularly limited, but is, for example, 32 mm. A width of second shield member 22 (a fourth width W4) in the direction parallel to first slit S1 is larger than the width of second roll 12 (second width W2).

Distances between first side surface portion 31 and second side surface portion 32 and each of pair of rolls 10 in movement direction B of workpiece W may be larger than the width of slit S1. Specifically, a distance between first side surface portion 31 and first roll 11 (a first distance D1) in movement direction B of workpiece W is larger than the width of first slit S1 (fifth width W5). A distance between second side surface portion 32 and second roll 12 (a second distance D2) in movement direction B of workpiece W is greater than the width of first slit S1 (fifth width W5). Each of first distance D1 and second distance D2 is not particularly limited, but is, for example, 12 mm. Each of first distance D1 and second distance D2 may be, for example, 1.5 times to 4 times of fifth width W5.

As shown in FIG. 3, first roll 11 is arranged so as to face first shield member 21. First shield member 21 is arranged upstream in movement direction B of workpiece W relative to first roll 11. First shield member 21 is arranged as close as possible to first roll 11. A distance between first roll 11 and first shield member 21 (a third distance D3) in movement direction B of workpiece W may be less than first distance D1.

Second roll 12 is arranged so as to face second shield member 22. Second shield member 22 is arranged upstream in the direction of movement B of workpiece W relative to second roll 12. Second shield member 22 is arranged as close as possible to second roll 12. A distance between second roll 12 and second shield member 22 (a fourth distance D4) in movement direction B of workpiece W may be less than second distance D2.

Figure 4:
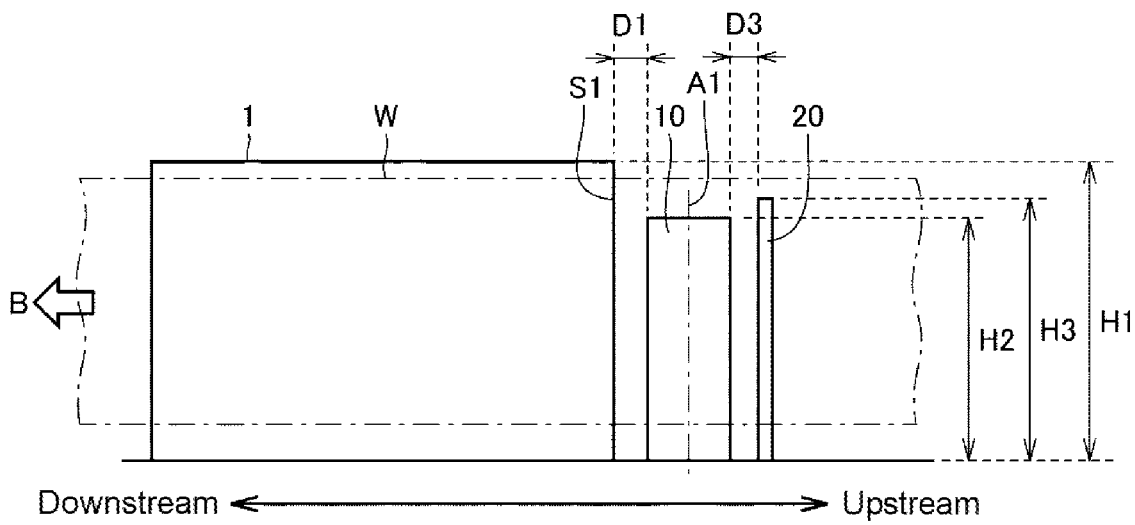
FIG. 4 is a schematic side view showing a configuration of a part of the wet treatment apparatus according to the first embodiment.

FIG. 4 is a schematic side view showing a configuration of a part of wet treatment apparatus 100 according to the first embodiment. As shown in FIG. 4, a height of slit S1 (a first height H1) is not particularly limited, but may be, for example, larger than a height of each of pair of rolls 10 (a second height H2). A height of each of pair of treatment-liquid shield members 20 (a third height H3) is not particularly limited, but may be larger than the height of each of pair of rolls 10 (second height H2), for example. The height of each of pair of treatment-liquid shield members 20 (third height H3) is not particularly limited, but may be, for example, less than the height of slit S1 (first height H1). The height of the slit is the length of the slit in the height direction. The height of the roll is the axial length of the roll. The height of each of pair of treatment-liquid shield members 20 is the length in the height direction of each of pair of treatment-liquid shield members 20.

In embodiment 1, pair of rolls 10 and pair of treatment-liquid shield members 20 are positioned upstream from wet treatment tank 1 in movement direction of workpiece W. According to this embodiment, the amount of treatment liquid 2 adhering to workpiece W located upstream from pair of treatment-liquid shield members 20 can be reduced. Alternatively, pair of rolls 10 and pair of treatment-liquid shield members 20 may be located downstream in the movement direction of workpiece W with respect to wet treatment tank 1. According to this embodiment, the amount of treatment liquid 2 adhering to workpiece W located downstream from pair of treatment-liquid shield members 20 can be reduced.

Second Embodiment

Next, a configuration of wet treatment apparatus 100 according to a second embodiment of the present disclosure will be described. Wet treatment apparatus 100 according to the second embodiment is different from wet treatment apparatus 100 according to the first embodiment, mainly in that wet treatment apparatus 100 includes a third roll 13, a fourth roll 14, and an auxiliary chamber 30, and other configurations are similar to those of wet treatment apparatus 100 according to the first embodiment. Hereinafter, a configuration different from wet treatment apparatus 100 according to the first embodiment will be mainly described.

Figure 5:
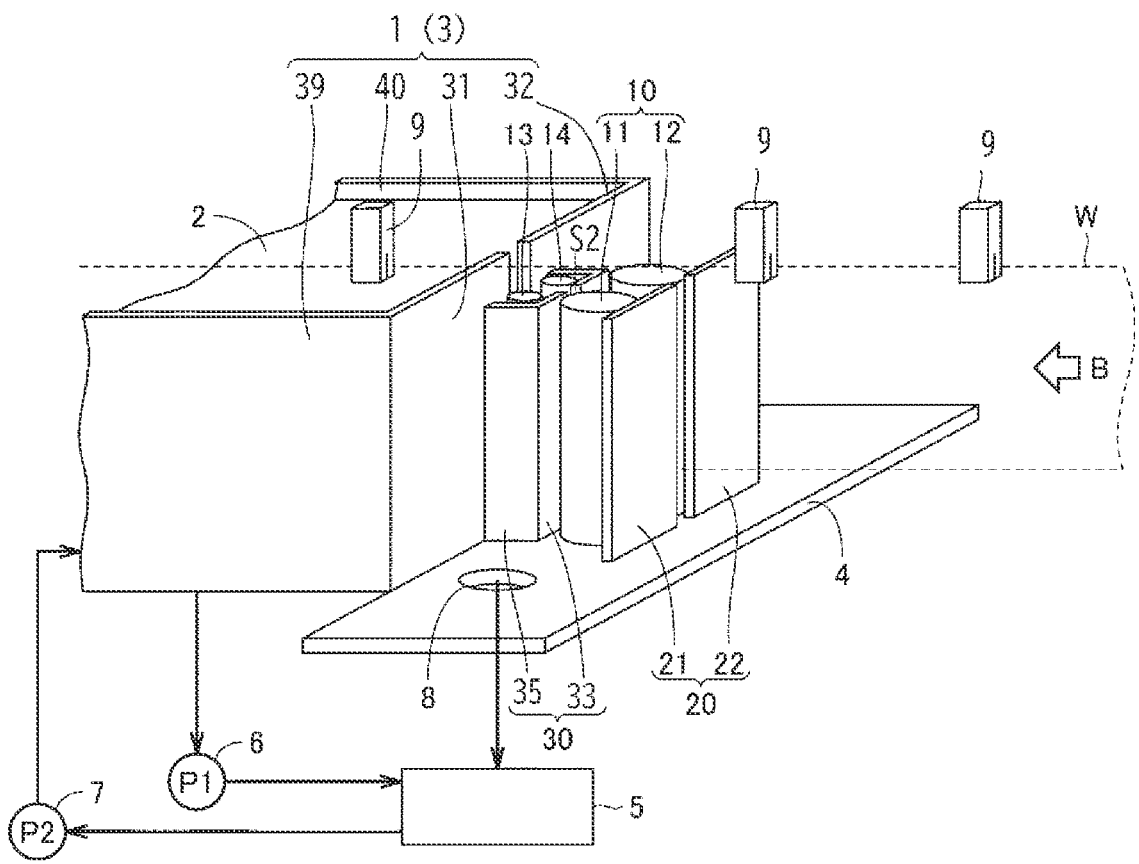
FIG. 5 is a schematic perspective view showing a configuration of a part of a wet treatment apparatus according to a second embodiment.

FIG. 5 is a schematic perspective view showing a configuration of a part of wet treatment apparatus 100 according to the second embodiment. As shown in FIG. 5, wet treatment tank 1 of wet treatment apparatus 100 according to the second embodiment has auxiliary chamber 30. Wet treatment apparatus 100 includes third roll 13 and fourth roll 14. Each of third roll 13 and fourth roll 14 is arranged inside auxiliary chamber 30.

Figure 6:
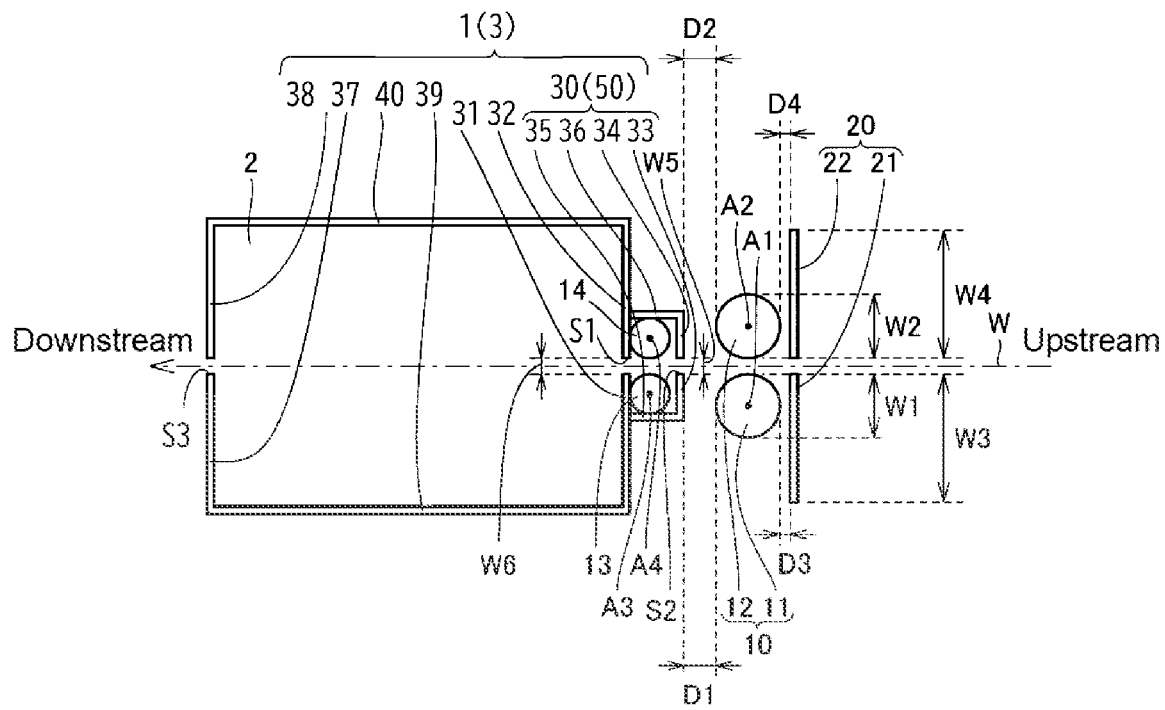
FIG. 6 is a schematic top view showing a configuration of a part of the wet treatment apparatus according to the second embodiment.

FIG. 6 is a schematic top view showing a configuration of a part of wet treatment apparatus 100 according to the second embodiment. As shown in FIG. 6, auxiliary chamber 30 is attached to upstream side surface portion 3.

Auxiliary chamber 30 is arranged between upstream side surface portion 3 and pair of rolls 10. Auxiliary chamber 30 includes a side surface portion 50 of auxiliary chamber, side surface portion 50 of auxiliary chamber includes a fifth side surface portion 35, and fifth side surface portion 35 is attached to first side surface portion 31. Side surface portion 50 of auxiliary chamber further includes a sixth side surface portion 36, and sixth side surface portion 36 is attached to second side surface portion 32. Fifth side surface portion 35 and sixth side surface portion 36 extend in a direction substantially parallel to movement direction B of workpiece W.

Side surface portion 50 of auxiliary chamber further includes a third side surface portion 33, and third side surface portion 33 is attached to fifth side surface portion 35. Side surface portion 50 of auxiliary chamber further includes a fourth side surface portion 34, and fourth side surface portion 34 is attached to sixth side surface portion 36. Third side surface portion 33 and fourth side surface portion 34 extend in a direction substantially perpendicular to movement direction B of workpiece W. A second slit S2 is provided between third side surface portion 33 and fourth side surface portion 34 along the height direction of wet treatment apparatus 100. First slit S1 is provided between first side surface portion 31 and second side surface portion 32. Workpiece W passes through each of second slit S2, first slit S1 and third slit S3 in order. Second slit S2, first slit S1, and third slit S3 are arranged on a straight line.

In a direction parallel to movement direction B of workpiece W, each of third roll 13 and fourth roll 14 is located between first side surface portion 31 and third side surface portion 33 and between second side surface portion 32 and fourth side surface portion 34. In a direction perpendicular to movement direction B of workpiece W, each of third roll 13 and fourth roll 14 is provided between fifth side surface portion 35 and sixth side surface portion 36. Third roll 13 rotates about a third rotation axis A3. Fourth roll 14 rotates about a fourth rotation axis A4. Workpiece W contacts each of third roll 13 and fourth roll 14. As workpiece W passes between third roll 13 and fourth roll 14, each of third roll 13 and fourth roll 14 rotates. A plane containing third rotation axis A3 and fourth rotation axis A4 may be perpendicular to movement direction B of workpiece W The plane containing third rotation axis A3 and fourth rotation axis A4 is substantially parallel to the plane containing first rotation axis A1 and second rotation axis A2.

As shown in FIG. 6, auxiliary chamber 30 is positioned the most upstream from wet treatment tank 1. Treatment liquid 2 stored in wet treatment tank 1 is discharged to the outside of wet treatment tank 1 through second slit S2 formed in auxiliary chamber 30. In other words, second slit S2 is a slit through which treatment liquid 2 is discharged to the outside of wet treatment tank 1. Second slit S2 is positioned the most upstream from wet treatment tank 1. Second slit S2 is sandwiched between third side surface portion 33 and fourth side surface portion 34. Third side surface portion 33 is located between third roll 13 and first roll 11. Fourth side surface portion 34 is located between fourth roll 14 and second roll 12.

As shown in FIG. 6, in the top view, a width of second slit S2 (fifth width W5) is not particularly limited, but is, for example, 5 mm. In a direction parallel to second slit S2, the width of first roll 11 (first width W1) is not particularly limited and is, for example, 32 mm. In the direction parallel to second slit S2, the width of first shield member 21 (third width W3) is larger than the width of first roll 11 (first width W1). In the direction parallel to second slit S2, the width of second roll 12 (second width W2) is not particularly limited, but is, for example, 32 mm. In the direction parallel to second slit S2, the width of second shield member 22 (fourth width W4) is larger than the width of second roll 12 (second width W2).

The distances between third side surface portion 33 and fourth side surface portion 34 and each of pair of rolls 10 in movement direction B of workpiece W may be larger than the width of second slit S2. Specifically, a distance between third side surface portion 33 and first roll 11 (first distance D1) in movement direction B of workpiece W is larger than the width of second slit S2 (fifth width W5). A distance between fourth side surface portion 34 and second roll 12 (second distance D2) in movement direction B of workpiece W is larger than the width of second slit S2 (fifth width W5). Each of first distance D1 and second distance D2 is not particularly limited, but is, for example, 12 mm. Each of first distance D1 and second distance D2 may be, for example, 1.5 times to 4 times of fifth width W5.

Figure 7:
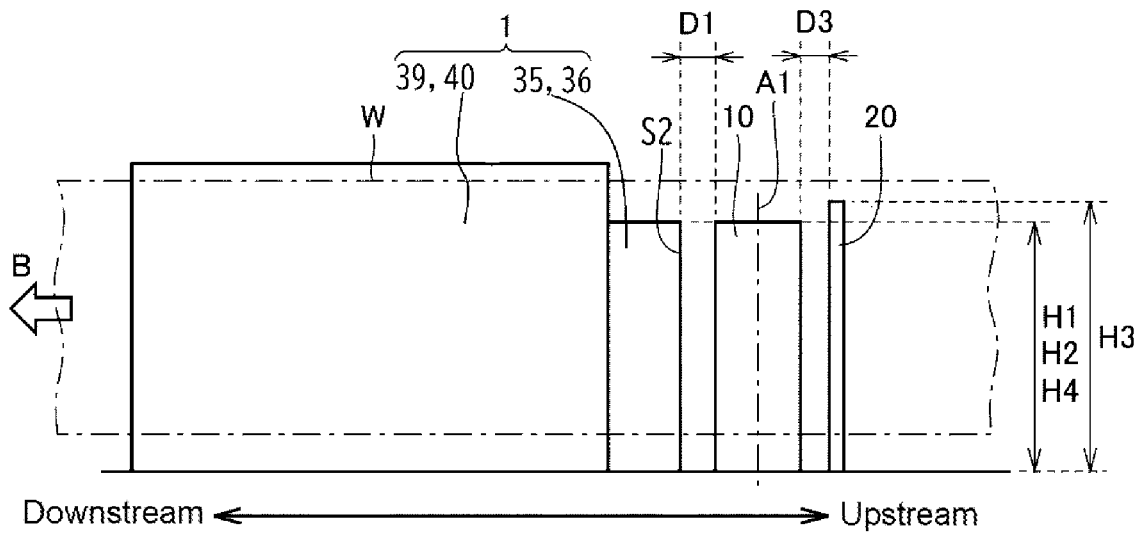
FIG. 7 is a schematic side view showing a configuration of a part of the wet treatment apparatus according to the second embodiment.

FIG. 7 is a schematic side view showing a configuration of wet treatment apparatus 100 according to the second embodiment. As shown in FIG. 7, a height of second slit S2 (first height H1) is not particularly limited, but may be, for example, the same as the height of each of third roll 13 and fourth roll 14 (a fourth height H4). The height of each of pair of treatment-liquid shield members 20 (third height H3) is not particularly limited, but may be, for example, larger than the height of each of third roll 13 and fourth roll 14 (fourth height H4). The height of each of first roll 1I and second roll 12 (second height H22) is not particularly limited, but may be, for example, the same as the height of each of third roll 13 and fourth roll 14 (fourth height H4). It is noted that, the height of the slit is the length of the slit in the height direction. The height of the roll is the axial length of the roll. The height of each of pair of treatment-liquid shield members 20 is the length in the height direction of each of pair of treatment-liquid shield members 20.

According to this embodiment, the amount of treatment liquid 2 adhering to workpiece W located upstream from pair of treatment-liquid shield members 20 can be reduced.

Alternatively, the height of each of first roll 11 and second roll 12 (second height 12) is at least equal to the height of second slit S2 (first height H1) or larger than the height of second slit S2 (first height H1). According to this embodiment, the amount of treatment liquid 2 adhering to the width of workpiece W located upstream from pair of treatment-liquid shield members 20 can be reduced.

Third Embodiment

Next, a configuration of wet treatment apparatus 100 according to a third embodiment of the present disclosure will be described. Wet treatment apparatus 100 according to the third embodiment is different from wet treatment apparatus 100 according to the second embodiment mainly in that pair of treatment-liquid shield members 20 is arranged downstream of wet treatment tank 1, and other configurations are similar to those of wet treatment apparatus 100 according to the second embodiment. Hereinafter, a configuration different from wet treatment apparatus 100 according to the second embodiment will be mainly described.

Figure 8:
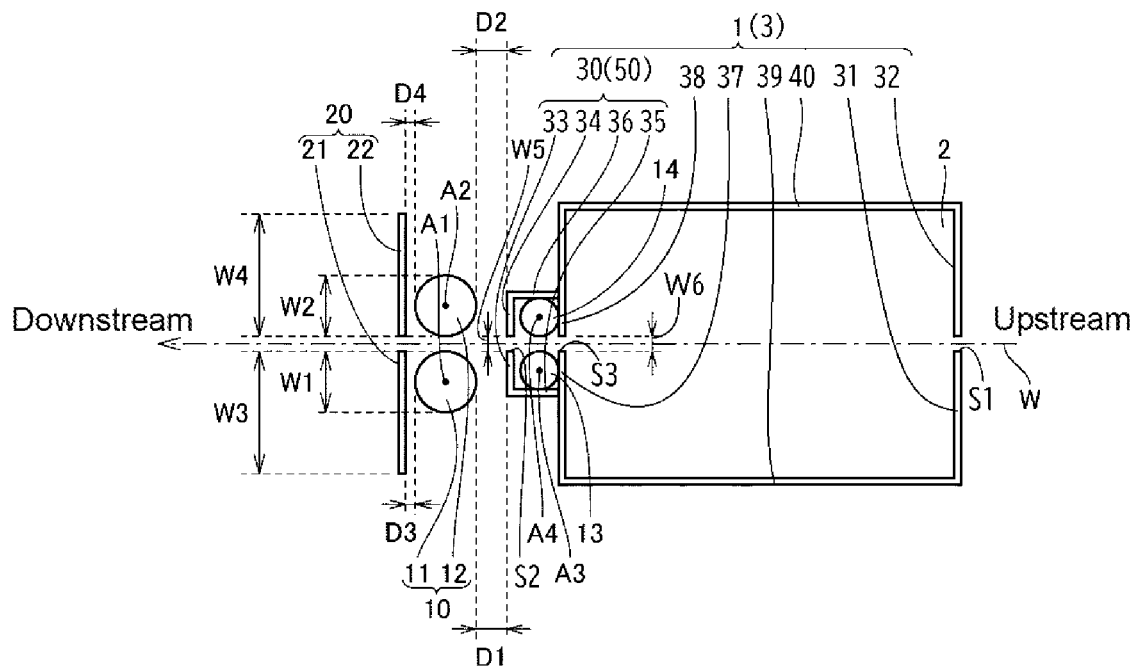
FIG. 8 is a schematic top view showing a configuration of a part of a wet treatment apparatus according to a third embodiment.

FIG. 8 is a schematic top view showing a configuration of a portion of wet treatment apparatus 100 according to the third embodiment. As shown in FIG. 8, pair of treatment-liquid shield members 20 are arranged downstream of wet treatment tank 1. Pair of rolls 10 is located downstream of wet treatment tank 1. Auxiliary chamber 30 is attached to downstream side surface portion 3 (seventh side surface portion 37 and eighth side surface portion 38). Auxiliary chamber 30 is located most downstream of wet treatment tank 1. Pair of rolls 10 and pair of treatment-liquid shield members 20 are provided, for example, in the gap between fourth treatment tank 94 and fifth treatment tank 95.

Pair of treatment-liquid shield members 20 are arranged downstream of pair of rolls 10. First shield member 21 is located downstream of first roll 11. Second shield member 22 is arranged downstream of second roll 12. First roll 11 is arranged downstream of third roll 13. Second roll 12 is arranged downstream of fourth roll 14.

According to this embodiment, the amount of treatment liquid 2 adhering to workpiece W located downstream of pair of treatment-liquid shield members 20 can be reduced.

Second slit S2 is provided between third side surface portion 33 and fourth side surface portion 34 of auxiliary chamber 30 along the height direction of wet treatment apparatus 100. Second slit S2 is located most downstream of wet treatment tank 1. Side surface portion 3 on the downstream side is provided with third slit S3. Side surface portion 3 in the upstream is provided with first slit S1 Workpiece W passes through each of first slit S1, third slit S3 and second slit S2 in order.

The height of each of first roll 11 and second roll 12 is at least equal to the height of second slit S2 (first height H1) or larger than the height of second slit S2. According to this embodiment, the amount of treatment liquid 2 adhering to workpiece W across the width direction located downstream from pair of treatment-liquid shield members 20 can be reduced.

Fourth Embodiment

Next, a configuration of wet treatment apparatus 100 according to a fourth embodiment of the present disclosure will be described. Wet treatment apparatus 100 according to the fourth embodiment is different from wet treatment apparatus 100 according to the first embodiment mainly in that the height of each of pair of rolls 10 is larger than the height of slit S1, and other configurations are similar to those of wet treatment apparatus 100 according to the first embodiment.

Hereinafter, a configuration different from wet treatment apparatus 100 according to the first embodiment will be mainly described.

Figure 9:
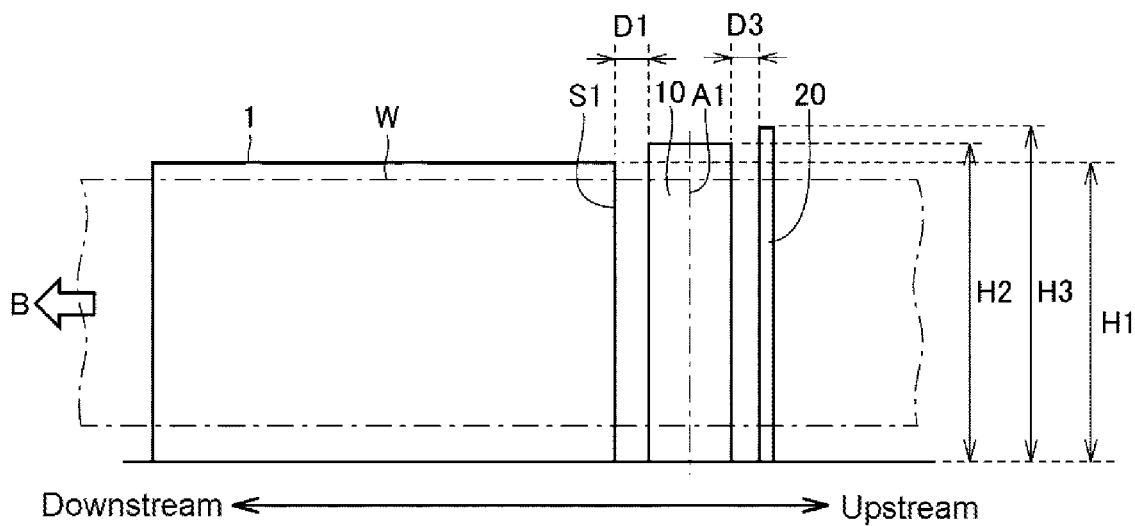
FIG. 9 is a schematic side view showing a configuration of a part of a wet treatment apparatus according to a fourth embodiment.

FIG. 9 is a schematic side view showing a configuration of wet treatment apparatus 100 according to the fourth embodiment. As shown in FIG. 9, the height of each of the pairs of rolls 10 (second height H2) may be, for example, larger than the height of slit S1 (first height H1). The height of first roll 11 is larger than the height of slit S1 The height of second roll 12 is larger than the height of slit S1. The height of each of pair of treatment-liquid shield members 20 (third height H3) may be, for example, larger than the height of slit S1 (first height H1). The height of first shield member 21 may be, for example, larger than the height of slit S1. The height of second shield member 22 may be, for example, larger than the height of slit S1. It is noted that, the height of the slit is the length of the slit in the height direction. The height of the roll is the axial length of the roll. The heights of first shield member 21 and second shield member 22 are the lengths of the shield members in the height direction.

According to this embodiment, the amount of treatment liquid 2 adhering to workpiece W across the width direction located downstream from pair of treatment-liquid shield members 20 can be reduced.

<Method of Manufacturing Flexible Printed Circuit Board>

Figure 10:
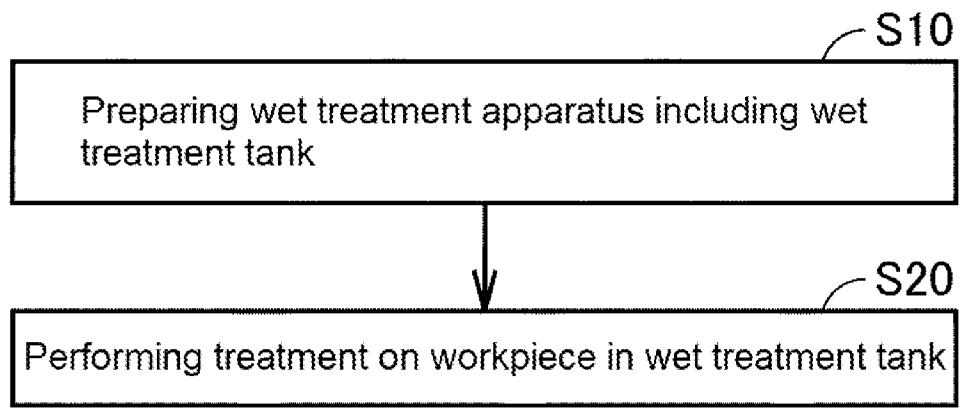
FIG. 10 is a flow diagram schematically showing a method of manufacturing a flexible printed circuit board according to the present disclosure.

Next, a method of manufacturing a flexible printed circuit board 200 according to the present disclosure will be described. FIG. 10 is a flow diagram schematically showing a method of manufacturing flexible printed circuit board 200 according to the present disclosure. As shown in FIG. 10, the method of manufacturing flexible printed circuit board 200 mainly includes a step (S10) of preparing a wet treatment apparatus including wet treatment tank 1 and a step (S20) of performing a treatment on a workpiece in wet treatment tank 1.

First, the step (S10) of preparing the wet treatment apparatus including wet treatment tank 1 is performed. In the step (S10) of preparing the wet treatment apparatus including wet treatment tank 1, for example, wet treatment apparatus 100 according to any one of the first embodiment to the fourth embodiment is prepared.

Next, the step (S20) of performing a treatment on the workpiece in wet treatment tank 1 is executed. As shown in FIG. 1, wet treatment apparatus 100 may mainly include conveying unit 101, winding unit 102, first treatment tank 91, second treatment tank 92, third treatment tank 93, fourth treatment tank 94, fifth treatment tank 95, and sixth treatment tank 96. Conveying unit 101 is a machine that feeds out workpiece W before processing. In conveying unit 101, workpiece W before processing is wound in a roller shape. Workpiece W is, for example, a long sheet-shaped flexible printed circuit board base member. Flexible printed circuit board 200 is obtained by the manufacturing method including the step (S10) of preparing the wet treatment apparatus including wet treatment tank 1 and the step (S20) of performing a treatment on the workpiece in wet treatment tank 1.

Figure 12:
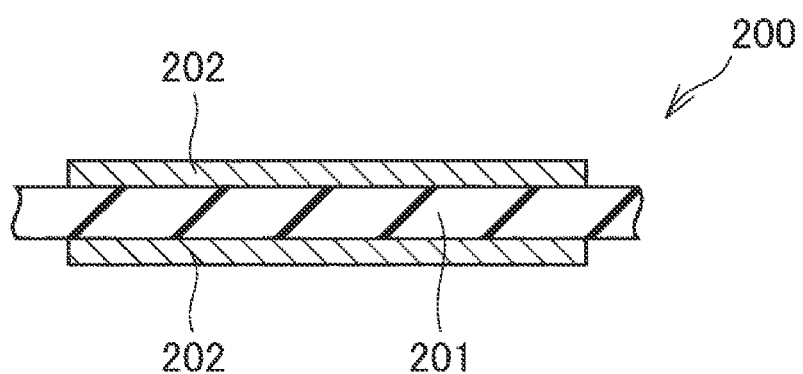
FIG. 12 is a schematic cross-sectional view showing a configuration of a flexible printed circuit board.

FIG. 12 is a schematic cross-sectional view showing a configuration of flexible printed circuit board 200. As shown in FIG. 12, flexible printed circuit board 200 includes, for example, a base member 201 and electrically conductive layers 202. Electrically conductive layers 202 are provided on both sides of base member 201. Base member 201 is, for example, a polyimide base member. Electrically conductive layer 202 is, for example, a copper layer.

As shown in FIG. 1, workpiece W is feed out from conveying unit 101. Workpiece W fed out from conveying unit 101 sequentially passes through first treatment tank 91, second treatment tank 92, and third treatment tank 93. In first treatment tank 91, a degreasing treatment is performed on workpiece W.

In second treatment tank 92, a water washing treatment is performed on workpiece W, In third treatment tank 93, an acid cleaning treatment is performed on workpiece W.

Next, an electroplating treatment is performed on workpiece W in fourth treatment tank 94. As shown in FIG. 3, workpiece W passes between pair of treatment-liquid shield members 20 and then passes between pair of rolls 10. Next, workpiece W passes through first slit S1 provided in wet treatment tank 1 (fourth treatment tank 94) and enters into wet treatment tank 1. Workpiece W is treated by treatment liquid 2 in wet treatment tank 1. Specifically, a plating treatment is performed on workpiece W by the plating liquid in wet treatment tank 1. Next, workpiece W passes through third slit S3 provided in wet treatment tank 1 and is discharged to the outside of wet treatment tank 1.

Next, workpiece W is transferred to fifth treatment tank 95. In fifth treatment tank 95, a water washing treatment is performed on workpiece W. Next, workpiece W is transferred to sixth treatment tank 96.

In sixth treatment tank 96, a drying treatment is performed on workpiece W. After the drying treatment in sixth treatment tank 96 is completed, workpiece W is collected by winding unit 102. As described above, flexible printed circuit board 200 is manufactured.

It is noted that, although described about when wet treatment tank 1 is the plating treatment tank in each embodiment, wet treatment tank 1 is not limited to the plating treatment tank. Wet treatment tank 1 may be an etching treatment tank, an acid cleaning treatment tank, a degreasing treatment tank, or the like.

In addition, the embodiments may be combined with each other as long as there is no contradiction. For example, pair of rolls 10 and pair of treatment-liquid shield members 20 may be provided both upstream and downstream of wet treatment tank 1.

Next, the effects of wet treatment apparatus 100 and the method of manufacturing flexible printed circuit board 200 according to the present disclosure will be described.

Figure 11:
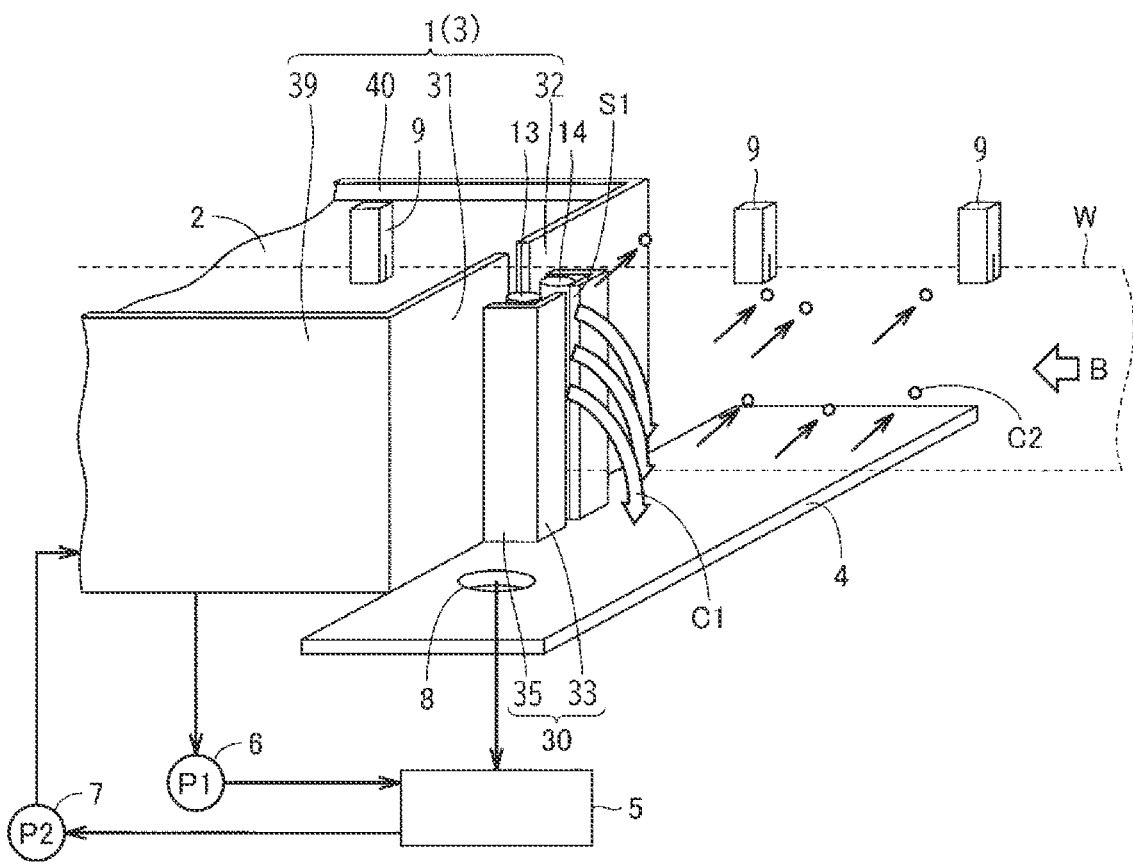
FIG. 11 is a schematic perspective view showing a configuration of a wet treatment apparatus according to a comparative example.

FIG. 11 is a schematic perspective view showing a configuration of wet treatment apparatus 100 according to a comparative example. As shown in FIG. 11, in wet treatment apparatus 100 according to the comparative example, liquid C1 leaking out from slit S1 of wet treatment tank 1 flows out in a direction substantially parallel to movement direction B of workpiece W, Leaked liquid C1 drops onto bottom plate 4 and then hits bottom plate 4 and bounces back, and droplets C2 of leaked liquid C1 adhere to workpiece W. As a result, the quality of workpiece W may be degraded.

According to wet treatment apparatus 100 and the method of manufacturing flexible printed circuit board 200 according to the embodiment, wet treatment apparatus 100 includes pair of rolls 10 outside first slit S1 or second slit S2 of wet treatment tank 1. Due to pair of rolls 10, liquid C1 leaked from first slit S1 or second slit S2 flows out in a direction substantially perpendicular to movement direction B of workpiece W. Thus, leaked liquid C1 is prevented from adhering to workpiece W.

Further, wet treatment apparatus 100 according to the embodiment includes pair of treatment-liquid shield members 20 located on the opposite side of slit S1 with respect to pair of rolls 10 in movement direction B of workpiece W and arranged such that workpiece W passes therebetween. Thus, droplets C2 generated by liquid C1 leaking from slit S1 hitting bottom plate 4 and bouncing back can be suppressed from adhering to workpiece W on the outer side of the treatment liquid shielding material 20 (on the side opposite to wet treatment tank 1) (refer to FIG. 2). As a result, the deterioration of the quality of workpiece W can be suppressed.

In addition, according to wet treatment apparatus 100 and the method of manufacturing flexible printed circuit board 200 according to the embodiment, the distances between first side surface portion 31 and second side surface portion 32 and each of pair of rolls 10 in movement direction B of workpiece W may be larger than the width of first slit S1 (first embodiment). Alternatively, in movement direction B of workpiece W, the distances between third side surface portion 33 and fourth side surface portion 34 and each of pair of rolls 10 may be larger than the width of second slit S2 (second embodiment). As a result, liquid C1 leaking from first slit S1 or second slit S2 flows out in the transverse direction (i.e., a direction substantially perpendicular to movement direction B of workpiece W) (refer to FIG. 2). Therefore, it is possible to further suppress the droplets of leaked liquid C1 from adhering to workpiece W.

Further, according to wet treatment apparatus 100 and the method of manufacturing flexible printed circuit board 200 according to the embodiment, the height of each of pair of rolls 10 may be the same as the height of first slit S1 or second slit S2, or may be larger than or equal to the height of first slit S1 or second slit S2. Accordingly, it is possible to prevent treatment liquid 2 from leaking from the upper side of first slit S1 or second slit S2 over pair of rolls 10 and adhering to workpiece W.

Further, according to wet treatment apparatus 100 and the method of manufacturing flexible printed circuit board 200 according to the embodiment, wet treatment tank 1 may be a plating treatment tank. In this case, treatment liquid 2 is a plating liquid. On the surface where the plating liquid is exposed to the atmosphere, oxygen from the atmosphere dissolves into the plating liquid. The oxygen acts as an oxidizing agent to oxidize the thin-film circuit of workpiece W, In particular, as in the case of adhered plating liquid where the surface area in contact with the atmosphere is large relative to the volume, oxygen is supplied from the atmosphere to the adhered liquid, so that the oxygen concentration of the adhered liquid rapidly increases. Therefore, the thin-film circuit of workpiece W is susceptible to corrosion. As compared with the thick-film circuit, the thin-film circuit used in the semi-additive process is more likely to cause conduction failure due to corrosion. By installing pair of rolls 10 and pair of treatment-liquid shield members 20 in wet treatment apparatus 100, it is possible to prevent the thin-film circuit of workpiece W from being corroded. Even when treatment liquid 2 is water, oxygen dissolved in the water acts as an oxidizing agent.

In addition, according to wet treatment apparatus 100 and the method of manufacturing flexible printed circuit board 200 according to the embodiment, pair of rolls 10 and pair of treatment-liquid shield members 20 may be positioned upstream from wet treatment tank 1 in movement direction B of workpiece W. Workpieces W downstream of wet treatment tank 1 have already been plated. Therefore, workpiece W downstream of wet treatment tank 1 is less susceptible to corrosion than workpiece W upstream of wet treatment tank 1. By disposing pair of rolls 10 and pair of treatment-liquid shield members 20 upstream of wet treatment tank 1, corrosion of workpiece W before plating can be effectively suppressed.

EXAMPLES (Sample Preparation)

First, flexible printed circuit boards 200 according to samples 1 to 4 were prepared. Flexible printed circuit boards 200 according to samples 1 and 2 were manufactured using wet treatment apparatus 100 according to the second embodiment (refer to FIG. 5). In the method of manufacturing flexible printed circuit board 200 according to samples 1 and 2, each line speed (moving speed of workpiece W) was set to 0.1 m/min and 0.5 m/min respectively.

Flexible printed circuit boards 200 according to samples 3 and 4 were manufactured using wet treatment apparatus 100 according to the second embodiment from which the pair of rollers and pair of treatment-liquid shield members 20 were removed (refer to FIG. 11). In the method of manufacturing flexible printed circuit board 200 according to samples 3 and 4, each line speed (moving speed of workpiece W) was set to 0.1 m/min and 0.5 m/min, respectively.

(Experimental Method)

Workpiece W was a long sheet-shaped base member. The base member was 250 mm wide. The base member was a polyimide base member. The thickness of the base member was 25 μm. Daisy-chain circuit patterns were formed on both sides of the base member. The circuit pattern was made of copper. The thickness of the circuit was 0.4 μm. The width of the circuit was 0.5 mm. The length of the circuit was 3.0 mm. The widthwise pitch of the circuit was 2.0 mm. The longitudinal pitch of the circuits was 5.0 mm.

The plating liquid was copper sulfate. The temperature of the plating liquid was 25° C. The material of each of first roll 11 and second roll 12 was polyolefin. The diameters of first roll 11 and second roll 12 were the 32 mm. The material of each of first shield member 21 and second shield member 22 was PVC (polyvinyl chloride). Each thickness of first shield member 21 and second shield member 22 was 3 mm. Each of first distance D1 and second distance D2 was 12 mm. Each of third distance D3 and fourth distance D4 was 0 mm. Second height H2 was the 300 mm.

After flexible printed circuit boards 200 according to samples 1 to 4 were manufactured using the above-described method, the number of defective (disconnected) portions in the daisy-chain circuit patterns provided on both surfaces of each base member was measured. The total number of circuits is 10,000. The defect rate is a ratio of the number of defective circuits to the total number of circuits.

(Experimental Results)

TABLE 1

| | Line speed | D1, D2 | D3, D4 | H2 | Defect rate |
|---|---|---|---|---|---|
| Sample 1 | 0.1 m/min | 12 mm | 0 mm | 300 mm | 0% |
| Sample 2 | 0.5 m/min | 12 mm | 0 mm | 300 mm | 0% |
| Sample 3 | 0.1 m/min | None | None | None | 0.67% |
| Sample 4 | 0.5 m/min | None | None | None | 0.02% |

As shown in Table 1, the defect rate of each of flexible printed circuit boards 200 according to samples 1 and 2 was 0%. On the other hand, the defect rate of each of flexible printed circuit boards 200 according to the samples 3 and 4 was 0.67% and 0.02%, respectively, From the above results, it was confirmed that by installing pair of treatment-liquid shield members 20 in wet treatment apparatus 100, it is possible to suppress the droplets of treatment liquid 2 from adhering to workpiece W and to reduce the defect rate of flexible printed circuit board 200.

It is to be understood that the embodiments and examples disclosed herein are illustrative in all respects and are not restrictive. The scope of the present invention is defined not by the embodiments and examples described above but by the claims, and is intended to include meanings equivalent to the claims and all modifications within the scope.

REFERENCE SIGNS LIST 1 wet treatment tank
2 treatment liquid
3 side surface portion
4 bottom plate
5 management tank
8 liquid discharge hole
9 transport clip
10 pair of rolls
11 first roll
12 second roll
13 third roll
14 fourth roll
20 pair of treatment-liquid shield members
21 first shield member
22 second shield member
30 auxiliary chamber
31 first side surface portion
32 second side surface portion
33 third side surface portion
34 fourth side surface portion
35 fifth side surface portion
36 sixth side surface portion
37 seventh side surface portion
38 eighth side surface portion
39 ninth side surface portion
40 tenth side surface portion
50 side surface portion of auxiliary chamber
91 first treatment tank
92 second treatment tank
93 third treatment tank
94 fourth treatment tank
95 fifth treatment tank
96 sixth treatment tank
100 wet treatment apparatus
101 conveying unit
102 winding unit
200 flexible printed circuit board
201 base member
202 electrically conductive layer
A1 first rotation axis
A2 second rotation axis
A3 third rotation axis
A4 fourth rotation axis
B movement direction
C1 liquid
C2 droplet
D1 first distance
D2 second distance
D3 third distance
D4 fourth distance
H1 first height (height of first slit S1 or second slit S2)
H2 second height
H3 third height
H4 fourth height
P1 first pump
P2 second pump
S1 first slit (slit)
S2 second slit
S3 third slit
W workpiece
W1 first width
W2 second width
W3 third width
W4 fourth width
W5 fifth width (width of first slit S1 or second slit S2)
W6 sixth width

The invention claimed is:

1. A wet treatment apparatus configured to treat a continuously moving sheet-shaped workpiece, the wet treatment apparatus comprising:

a wet treatment tank including a side surface portion having a first slit, the first slit extending in a height direction in such a manner as to allow the workpiece to pass through the first slit;

a pair of rolls located outside the wet treatment tank, the pair of rolls being spaced apart from the first slit and being arranged in such a manner as to nip the workpiece in a transverse direction; and a pair of treatment-liquid shield members disposed on a side opposite to a side on which the wet treatment tank is disposed with the pair of rolls interposed between the pair of treatment-liquid shield members and the wet treatment tank in a movement direction of the workpiece, wherein the side surface portion includes a first side surface portion and a second side surface portion with the first slit formed between the first side surface portion and the second side surface portion, wherein the pair of treatment-liquid shield members include a first shield member and a second shield member, and the first shield member and the second shield member are arranged in such a manner as to allow the workpiece to pass between the first shield member and the second shield member, wherein the pair of rolls include a first roll located between the first shield member and the first side surface portion and a second roll located between the second shield member and the second side surface portion, and wherein, in a direction parallel to a width of the first slit, a width of the first shield member is larger than a width of the first roll, and a width of the second shield member is larger than a width of the second roll, wherein a distance between the first side surface portion and the first roll in the movement direction of the workpiece and a distance between the second side surface portion and the second roll in the movement direction of the workpiece are each larger than the width of the first slit.

2. The wet treatment apparatus according to claim 1, wherein a height of the first roll and a height of the second roll are each equal to a height of the first slit or larger than the height of the first slit.

3. The wet treatment apparatus according to claim 1, wherein the pair of rolls and the pair of treatment-liquid shield members are positioned upstream from the wet treatment tank in the movement direction of the workpiece.

4. The wet treatment apparatus according to claim 1, wherein the wet treatment tank is a plating treatment tank.

5. The wet treatment apparatus according to claim 1, wherein the pair of treatment-liquid shield members each have a plate-like shape.

6. A wet treatment apparatus configured to treat a continuously moving sheet-shaped workpiece, the wet treatment apparatus comprising:

a wet treatment tank including a side surface portion having a first slit, the first slit extending in a height direction in such a manner as to allow the workpiece to pass through the first slit;

a pair of rolls located outside the wet treatment tank, the pair of rolls being arranged in such a manner as to nip the workpiece in a transverse direction;

a pair of treatment-liquid shield members disposed on a side opposite to a side on which the wet treatment tank is disposed with the pair of rolls interposed between the pair of treatment-liquid shield members and the wet treatment tank in a movement direction of the workpiece;

an auxiliary chamber provided between the side surface portion and the pair of rolls; and an additional pair of rolls provided inside the auxiliary chamber, wherein the auxiliary chamber includes a side surface portion of the auxiliary chamber having a second slit, the second slit extending in a height direction in such a manner as to allow the workpiece to pass through the second slit, wherein the side surface portion of the auxiliary chamber includes a third side surface portion and a fourth side surface portion with the second slit formed between the third side surface portion and the fourth side surface portion, wherein the pair of treatment-liquid shield members include a first shield member and a second shield member, and the first shield member and the second shield member are arranged in such a manner as to allow the workpiece to pass between the first shield member and the second shield member, wherein the pair of rolls include a first roll located between the first shield member and the third side surface portion and a second roll located between the second shield member and the fourth side surface portion, and wherein, in a direction parallel to a width of the second slit, a width of the first shield member is larger than a width of the first roll, and a width of the second shield member is larger than a width of the second roll, wherein a distance between the third side surface portion and the first roll in the movement direction of the workpiece and a distance between the fourth side surface portion and the second roll in the movement direction of the workpiece are each larger than the width of the second slit.

7. The wet treatment apparatus according to claim 6, wherein a height of the first roll and a height of the second roll are each equal to a height of the second slit or larger than the height of the second slit.

8. The wet treatment apparatus according to claim 6, wherein the pair of rolls, the pair of treatment-liquid shield members, the auxiliary chamber, and the additional pair of rolls are positioned upstream from the wet treatment tank in the movement direction of the workpiece.

9. A method of manufacturing a flexible printed circuit board, the method comprising:

preparing a wet treatment apparatus including a wet treatment tank; and performing a wet treatment on a flexible printed circuit board base member having a sheet-like shape in the wet treatment tank, wherein the wet treatment apparatus is a wet treatment apparatus configured to treat the flexible printed circuit board base member that continuously moves, wherein the wet treatment apparatus includes a wet treatment tank including a side surface portion having a first slit, the first slit extending in a height direction in such a manner as to allow the flexible printed circuit board base member to pass through the first slit, a pair of rolls located outside the wet treatment tank, the pair of rolls being spaced apart from the first slit and being arranged in such a manner as to nip the flexible printed circuit board base member in a transverse direction, and a pair of treatment-liquid shield members disposed on a side opposite to a side on which the wet treatment tank is disposed with the pair of rolls interposed between the pair of treatment-liquid shield members and the wet treatment tank in a movement direction of the flexible printed circuit board base member, wherein the side surface portion includes a first side surface portion and a second side surface portion with the first slit formed between the first side surface portion and the second side surface portion, wherein the pair of treatment-liquid shield members include a first shield member and a second shield member, and the first shield member and the second shield member are arranged in such a manner as to allow the flexible printed circuit board base member to pass between the first shield member and the second shield member, wherein the pair of rolls include a first roll located between the first shield member and the first side surface portion and a second roll located between the second shield member and the second side surface portion, and wherein, in a direction parallel to a width of the first slit, a width of the first shield member is larger than a width of the first roll, and a width of the second shield member is larger than a width of the second roll, wherein a distance between the first side surface portion and the first roll in the movement direction of the flexible printed circuit board base member and a distance between the second side surface portion and the second roll in the movement direction of the flexible printed circuit board base member are each larger than the width of the first slit.

10. The method of manufacturing the flexible printed circuit board according to claim 9, wherein a height of the first roll and a height of the second roll are each equal to a height of the first slit or larger than the height of the first slit.

11. The method of manufacturing the flexible printed circuit board according to claim 9, wherein the pair of rolls and the pair of treatment-liquid shield members are positioned upstream from the wet treatment tank in the movement direction of the flexible printed circuit board base member.

12. The method of manufacturing the flexible printed circuit board according to claim 9, wherein the wet treatment tank is a plating treatment tank.

13. The method of manufacturing the flexible printed circuit board according to claim 9, wherein the pair of treatment-liquid shield members each have a plate-like shape.

14. The method of manufacturing the flexible printed circuit board according to claim 9, wherein a moving speed of the flexible printed circuit board base member is 0.1 m/min to 0.5 m/min.

15. A method of manufacturing a flexible printed circuit board, the method comprising:

preparing a wet treatment apparatus including a wet treatment tank; and performing a wet treatment on a flexible printed circuit board base member having a sheet-like shape in the wet treatment tank, wherein the wet treatment apparatus is a wet treatment apparatus configured to treat the flexible printed circuit board base member that continuously moves, wherein the wet treatment apparatus includes a wet treatment tank including a side surface portion having a first slit, the first slit extending in a height direction in such a manner as to allow the flexible printed circuit board base member to pass through the first slit, a pair of rolls located outside the wet treatment tank, the pair of rolls being arranged in such a manner as to nip the flexible printed circuit board base member in a transverse direction, a pair of treatment-liquid shield members disposed on a side opposite to a side on which the wet treatment tank is disposed with the pair of rolls interposed between the pair of treatment-liquid shield members and the wet treatment tank in a movement direction of the flexible printed circuit board base member, an auxiliary chamber provided between the side surface portion and the pair of rolls, and an additional pair of rolls provided inside the auxiliary chamber, wherein the auxiliary chamber includes a side surface portion of the auxiliary chamber having a second slit, the second slit extending in a height direction in such a manner as to allow the flexible printed circuit board base member to pass through the second slit, wherein the side surface portion of the auxiliary chamber includes a third side surface portion and a fourth side surface portion with the second slit formed between the third side surface portion and the fourth side surface portion, wherein the pair of treatment-liquid shield members include a first shield member and a second shield member, and the first shield member and the second shield member are arranged in such a manner as to allow the flexible printed circuit board base member to pass between the first shield member and the second shield member, wherein the pair of rolls include a first roll located between the first shield member and the third side surface portion and a second roll located between the second shield member and the fourth side surface portion, and wherein, in a direction parallel to a width of the second slit, a width of the first shield member is larger than a width of the first roll, and a width of the second shield member is larger than a width of the second roll, wherein a distance between the third side surface portion and the first roll in the movement direction of the flexible printed circuit board base member and a distance between the fourth side surface portion and the second roll in the movement direction of the flexible printed circuit board base member are each larger than the width of the second slit.

16. The method of manufacturing the flexible printed circuit board according to claim 15, wherein a height of the first roll and a height of the second roll are each equal to a height of the second slit or larger than the height of the second slit.

17. The method of manufacturing the flexible printed circuit board according to claim 15, wherein the pair of rolls, the pair of treatment-liquid shield members, the auxiliary chamber, and the additional pair of rolls are positioned upstream from the wet treatment tank in the movement direction of the flexible printed circuit board base member.

\* \* \* \* \*